United States Patent
Kotani

(10) Patent No.: US 8,223,504 B2
(45) Date of Patent: Jul. 17, 2012

(54) STRUCTURE FOR SUPPORTING PRINTED WIRING BOARD

(75) Inventor: Kazunori Kotani, Nara (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 302 days.

(21) Appl. No.: 12/630,232

(22) Filed: Dec. 3, 2009

(65) Prior Publication Data

US 2010/0142165 A1    Jun. 10, 2010

(30) Foreign Application Priority Data

Dec. 5, 2008   (JP) ................. 2008-311365

(51) Int. Cl.
*H05K 9/00* (2006.01)
(52) U.S. Cl. ............ 361/753; 361/799; 174/377
(58) Field of Classification Search ............ 361/753, 361/799, 800, 816, 818; 174/350, 377
See application file for complete search history.

(56) References Cited

U.S. PATENT DOCUMENTS

| | | | | |
|---|---|---|---|---|
| 4,658,334 A | * | 4/1987 | McSparran et al. | 361/800 |
| 5,672,844 A | * | 9/1997 | Persson et al. | 174/387 |
| 5,747,735 A | * | 5/1998 | Chang et al. | 174/51 |
| 6,049,469 A | * | 4/2000 | Hood et al. | 361/818 |
| 6,242,690 B1 | * | 6/2001 | Glover | 174/387 |
| 6,538,196 B1 | * | 3/2003 | MacDonald et al. | 174/377 |
| 6,683,245 B1 | * | 1/2004 | Ogawa et al. | 174/382 |
| 6,937,475 B2 | * | 8/2005 | Rigimbal et al. | 361/752 |
| 6,980,439 B2 | * | 12/2005 | Schultz et al. | 361/753 |
| 7,259,969 B2 | * | 8/2007 | Zarganis et al. | 361/800 |
| 7,576,993 B2 | * | 8/2009 | Hsieh et al. | 361/753 |
| 7,643,311 B2 | * | 1/2010 | Coffy | 361/818 |
| 7,738,264 B2 | * | 6/2010 | Christol et al. | 361/818 |
| 2005/0276027 A1 | * | 12/2005 | Shen et al. | 361/753 |
| 2009/0154117 A1 | * | 6/2009 | Hsieh et al. | 361/753 |
| 2010/0142111 A1 | * | 6/2010 | Kotani | 361/220 |

FOREIGN PATENT DOCUMENTS

JP    2000299577    10/2000

* cited by examiner

*Primary Examiner* — Dameon Levi
(74) *Attorney, Agent, or Firm* — Novak Druce + Quigg LLP

(57) ABSTRACT

A structure for supporting a printed wiring board housed in a housing of an electronic device. The supporting structure includes a first projection formed on the housing and projecting toward the printed wiring board. The electronic device includes a conductor plate, which is grounded and accommodated in the housing. A second projection is formed on the conductor plate and projects toward the printed wiring board. The printed wiring board includes a substrate and a ground layer, which is arranged on the substrate. The first projection of the housing and the second projection of the conductor plate hold and support the printed wiring board in between and thereby electrically connect the ground layer to the conductor plate.

20 Claims, 6 Drawing Sheets

STRUCTURE FOR SUPPORTING PRINTED WIRING BOARD

CROSS-REFERENCE TO RELATED APPLICATIONS

This application is based upon and claims the benefit of priority from prior Japanese Patent Application No. 2008-311365, filed on Dec. 5, 2008, the entire contents of which are incorporated herein by reference.

BACKGROUND OF THE INVENTION

The present invention relates to a structure for supporting a printed wiring board accommodated in a housing of an electronic device.

A housing of an electronic device houses a printed wiring board, which includes electronic components for controlling the electronic device. The housing may accommodate a printed wiring board including, for example, a switch, which is pressed when operated by a user. Generally, screws (small male screws) are used to support and fix the printed wiring board (refer to Japanese Laid-Open Patent Publication No. 2000-299577).

More specifically, referring to FIG. 1, in a printed wiring board supporting structure of the prior art, a screw 108, which extends through a printed wiring board 104, is fastened to a housing 103 of an electronic device to support and fix the printed wiring board 104.

To achieve electromagnetic compatibility (EMC), the housing of an electronic device may be plated. However, it is desirable that plating of the housing be avoided from environmental aspects. In such a case, to achieve EMC, an electronic device may include a grounded conductor plate. The conductor plate is fixed to the printed wiring board and electrically connected to a ground layer of the printed wiring board.

More specifically, referring to FIG. 2, in a printed wiring board supporting structure of the prior art, a screw 109, which is conductive and extends through the printed wiring board 104, is fastened to a conductor plate 105, which is accommodated in the housing 103, to support and fix the printed wiring board 104. When supporting and fixing the printed wiring board 104 in this manner, the conductive screw 109 electrically connects the ground layer (not shown), which forms the printed wiring board 104, and the conductor plate 105 and thereby grounds the ground layer.

There is a demand for lowering the cost of electronic devices. The number of components, such as screws, may be reduced to satisfy this demand.

However, to support the printed wiring board and ground the ground layer with the conductor plate, fastening components (e.g., the screw 108), which extend through the printed wiring board, and connecting components (e.g., the screw 109), which are conductive, are necessary.

It is thus desirable that a structure for supporting a printed wiring board without using fastening components such as a screw be provided. It is further desirable that a structure for supporting a printed wiring board ground a ground layer with a conductor plate without using connecting components such as a screw be provided.

SUMMARY OF THE INVENTION

One aspect of the present invention is a structure for supporting a printed wiring board housed in a housing of an electronic device. The supporting structure includes a first projection formed on the housing and projecting toward the printed wiring board. The electronic device includes a conductor plate, which is grounded and accommodated in the housing. A second projection is formed on the conductor plate and projects toward the printed wiring board. The printed wiring board includes a substrate and a ground layer, which is arranged on the substrate. The printed wiring board is supported and held between the first projection of the housing and the second projection of the conductor plate to electrically ground the ground layer through the conductor plate.

A further aspect of the present invention is an electronic device provided with a printed wiring board including a substrate and a ground layer, which is arranged on the substrate. A housing, which houses the printed wiring board, includes a first projection formed on the housing and projecting toward the printed wiring board. A conductor plate, which is grounded and accommodated in the housing, includes a second projection formed on the conductor plate and projecting toward the printed wiring board. The printed wiring board is supported and held between the first projection of the housing and the second projection of the conductor plate to electrically ground the ground layer through the conductor plate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

Figure 1:
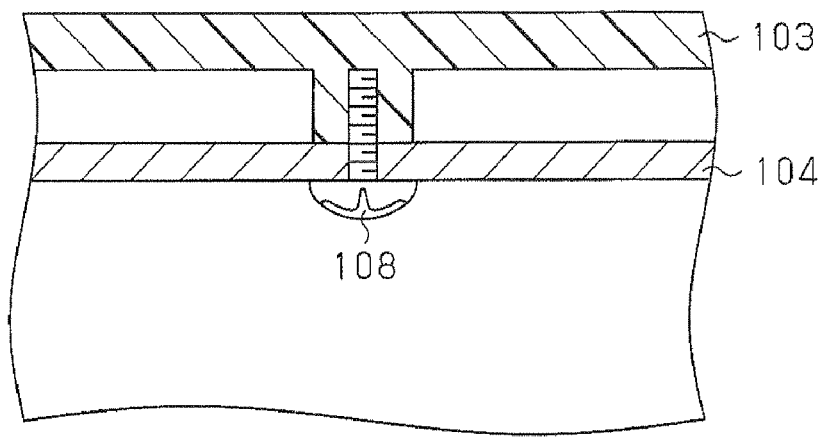
FIG. 1 is a cross-sectional view showing a prior art structure for supporting a printed wiring board.
Figure 2:
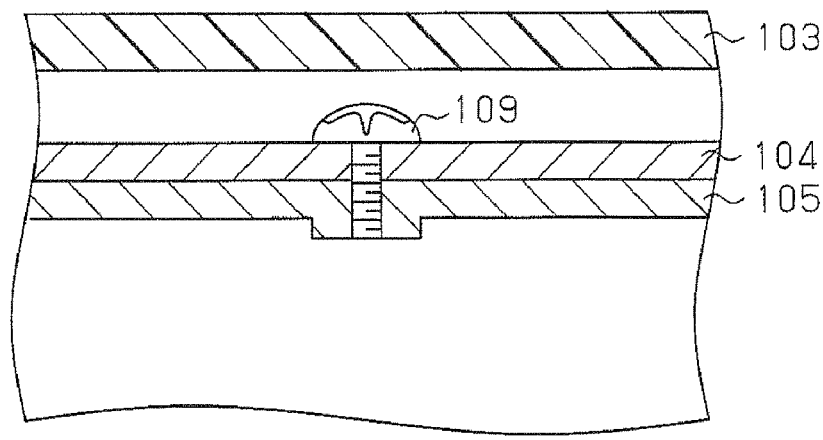
FIG. 2 is a cross-sectional view showing a prior art structure for supporting a printed wiring board.

A video projector 1, which is one embodiment of an electronic device according to the present invention, will now be discussed with reference to the drawings. In the drawings, arrow S indicates a planar direction, which is parallel to a component mounting surface of a printed wiring board 4. Further, arrow T indicates a thicknesswise direction (widthwise direction), which is orthogonal to the planar direction.

Figure 3:
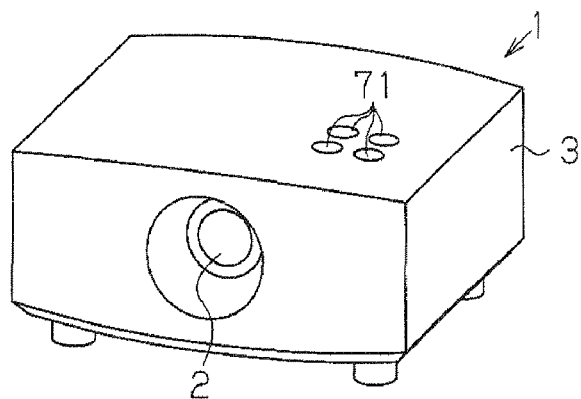
FIG. 3 is a perspective view showing the outer appearance of a video projector serving as an electronic device according to one embodiment of the present invention.

Referring to FIG. 3, the video projector 1 is a front projector that projects light toward the front with a projection lens 2 to display a picture. For instance, the video projector 1 is a liquid crystal display (LCD) projector, which uses LCD panels (not shown) as light bulbs that transmit light and generate pictures.

Figure 4:
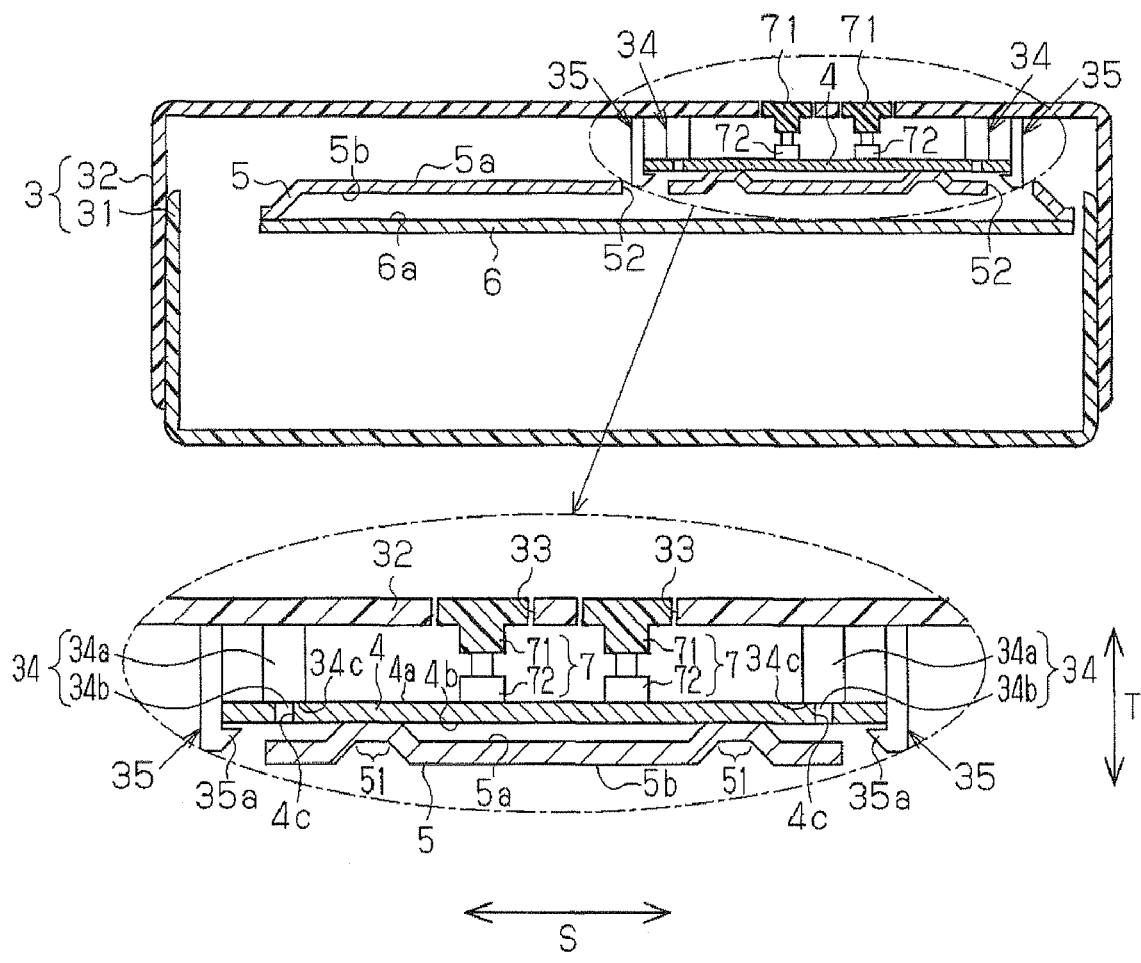
FIG. 4 is a cross-sectional view schematically showing the structure of the video projector of FIG. 3.

As shown in FIG. 4, the video projector 1 includes a housing 3, which houses optical components such as LCD panels, a printed wiring board 4, which is housed in the housing 3, a conductor plate 5, which is housed in the housing 3 and grounded, and a printed wiring board 6, which includes main control circuits connected to the printed wiring board 4. FIG. 4 is a cross-sectional view schematically showing the structure for supporting the printed wiring board 4 according to the present invention and does not show structures for supporting the optical components and the printed wiring board 6 in the video projector 1.

The housing 3, the overall shape of which is a rectangular cuboid, includes a case 31 and a cover 32. The case 31 is hollow and defines the interior of the housing 3. The cover 32 covers the case 31 and includes insertion holes 33. Each insertion hole 33 receives a push button 71, which is operated by a user.

Figure 5:
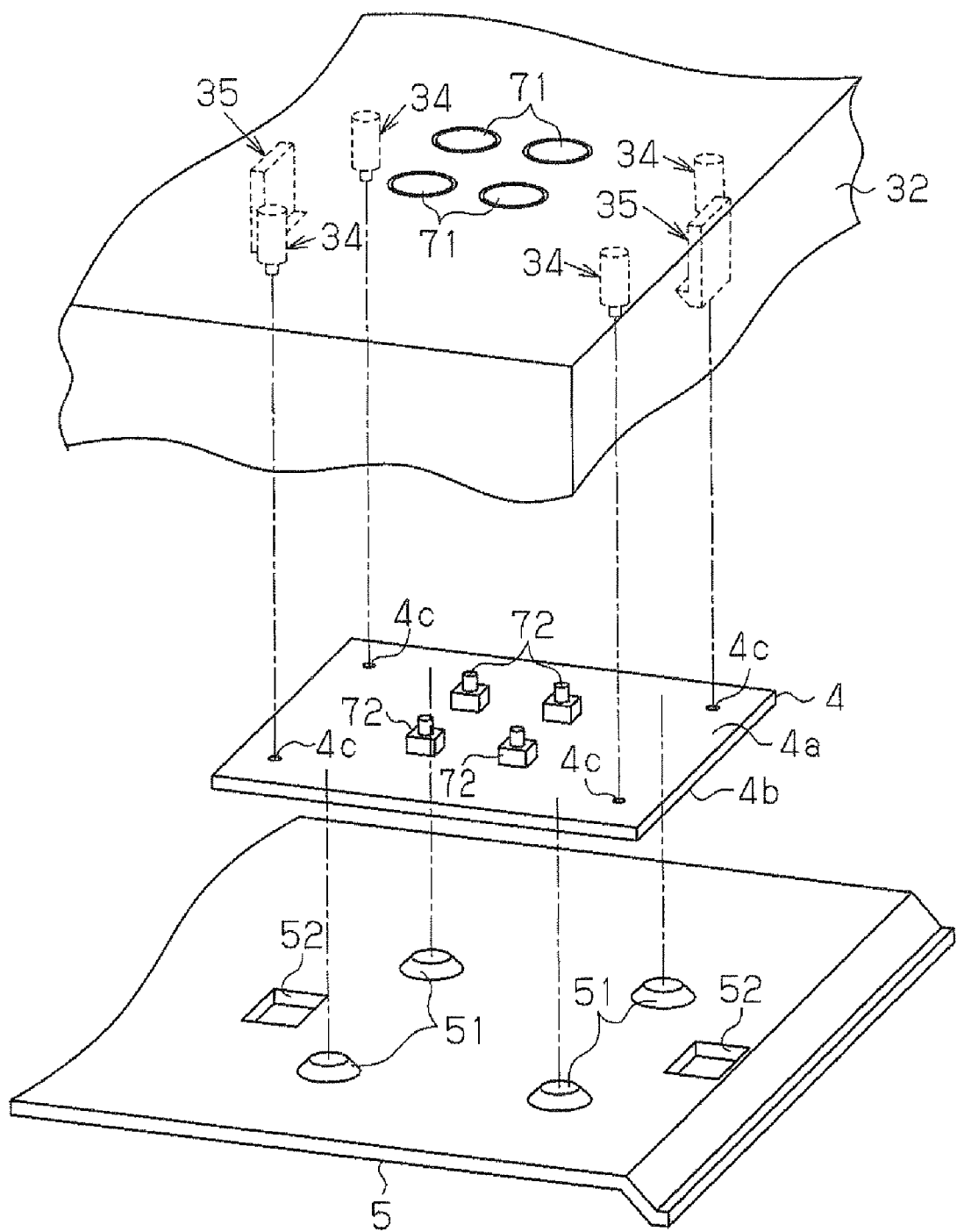
FIG. 5 is an exploded perspective view of a housing, a printed wiring board, and a conductor plate shown in FIG. 4.

As shown in FIGS. 4 and 5, the cover 32 of the housing 3 includes at least one (e.g., four) wiring board upper surface support 34 and at least one (e.g., two) wiring board lower surface support 35. The upper surface supports 34 support an upper surface 4a of the printed wiring board 4, and the lower surface supports 34 support a lower surface 4b of the printed wiring board 4. The upper and lower surface supports 34 and 35 are projections that project from the cover 32 toward the printed wiring board 4 and are formed integrally with the cover 32 from a resin. In the present embodiment, as viewed in FIG. 5, four upper surface supports 34, which are arranged in correspondence with the four corners of the printed wiring board 4, and two lower surface supports 35 are formed integrally with the lower side of the cover 32. The two lower surface supports 35 may be arranged in correspondence with two opposing sides of the printed wiring board 4.

Each upper surface support 34 is, for example, cylindrical. One part of the upper surface support 34 extends through the printed wiring board 4, while another part contacts the upper surface 4a of the printed wiring board 4. For example, the upper surface support 34 includes a large diameter portion 34a, which projects from the cover 32 toward the printed wiring board 4, and a small diameter portion 34b, which projects from the large diameter portion 34a toward the printed wiring board 4. The small diameter portion 34b has a smaller diameter than the large diameter portion 34a and is inserted into the printed wiring board 4. When the cover 32 is fixed to the case 31, a step 34c, which is formed by the large diameter portion 34a and small diameter portion 34b, contacts the upper surface 4a of the printed wiring board 4. Accordingly, the step 34c restricts upward movement of the printed wiring board 4 in the thicknesswise direction T. Further, the small diameter portion 34b, which extends through the printed wiring board 4, restricts movement of the printed wiring board 4 in the planar direction S.

Each lower surface support 35 is, for example, hook-shaped so that it can support the lower surface 4b of the printed wiring board 4. For example, the lower surface support 35 has a distal end, which forms a hook 35a. The hook 35a is formed to hold the printed wiring board 4. When the cover 32 is fixed to the case 31, the lower surface support 35 does not contact the lower surface 4b of the printed wiring board 4. That is, the lower surface support 35 is not used to fix the printed wiring board 4. Rather, the lower surface support 35 is used to loosely hold the printed wiring board 4 at a predetermined position relative to the cover 32. To loosely hold the printed wiring board 4 with the lower surface supports 35, the printed wiring board 4 is forced into the space under the cover 32 between the lower surface supports 35 by resiliently deforming the lower surface supports 35.

Figure 6:
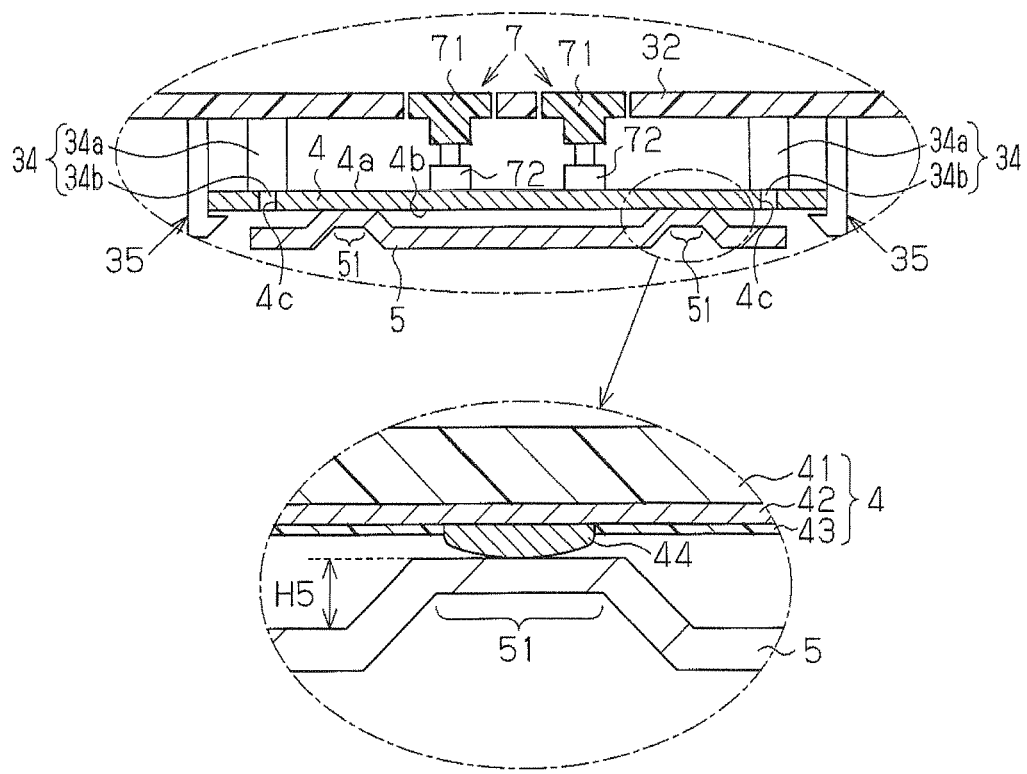
FIG. 6 is a cross-sectional view showing a structure for supporting the printed wiring board of FIG. 5.

Referring to FIG. 6, the printed wiring board 4 is a rigid printed wiring board including a substrate 41, a ground layer 42, and an insulative layer 43. The substrate 41 is formed from an insulative resin. The ground layer 42 is arranged on the substrate 41. The insulative layer 43 is arranged on parts of the ground layer 42. The printed wiring board 4 is a double-surface printed wiring board.

The ground layer 42 is a conductive layer, which is grounded and formed from a metal such as copper. In the present embodiment, the ground layer 42 is arranged on the lower surface 4b of the printed wiring board 4 (i.e., the surface opposite to the upper surface 4a on which switches 72 are arranged).

The insulative layer 43 is a cover layer arranged on the ground layer 42 and formed from an insulative resin. The insulative layer 43 is not arranged on the ground layer 42 at locations where the ground layer 42 is electrically connected to the conductor plate 5.

Ground connectors 44, which are formed from at least one conductor, are arranged on the ground layer 42 at locations that are free of the insulative layer 43. The ground connectors 44 are formed from, for example, a solder cream. The ground connectors 44 are more projected toward the conductor plate 5 from the ground layer 42 than the insulative layer 43.

The printed wiring board 4 includes insertion holes 4c into which the small diameter portions 34b of the upper surface supports 34 are inserted. In the present embodiment, the insertion holes 4c are formed in the four corners of the printed wiring board 4.

The switches 72 are arranged on the printed wiring board 4. In addition to the ground layer 42, the printed wiring board 4 includes a conductive layer (not shown) having a predetermined wiring pattern. Connection terminals formed by parts of the conductive layer are electrically connected to terminals (not shown) of the switches 72. Each push button 71 and the corresponding switch 72 form a push button switch 7.

The conductor plate 5 is a metal plate formed from, for example, steel or aluminum. Referring to FIG. 4, to achieve electromagnetic compatibility (EMC), the conductor plate 5 covers the two printed wiring boards 4 and 6. For example, the conductor plate 5 has an upper surface 5a, which covers the lower surface 4b of the printed wiring board, and a lower surface 5b, which covers an upper surface 6a of the printed wiring board 6.

Further, the conductor plate 5 includes at least one (for example, four as shown in FIG. 5) projection 51 projecting toward the printed wiring board 4. The projections 51 are formed to contact the lower surface 4b of the printed wiring board 4. Each projection 51 is, for example, formed by pressing out the conductor plate 5 and is circular when viewed in the thicknesswise direction T. When the cover 32 is fixed to the case 31, the projections 51 of the conductor plate 5 contact the ground connectors 44 on the lower surface 4b of the printed wiring board 4. Accordingly, the projections 51 restrict downward movement of the printed wiring board 4 in the thicknesswise direction T. Further, the contact between the projections 51 and the ground connectors 44 electrically connect the ground layer 42 and the conductor plate 5 through the ground connectors 44. The projections 51, which support the printed wiring board 4 from below, preferably support the printed wiring board 4 at positions located inward from the upper surface supports 34, which support the printed wiring board 4 from above. This supports the printed wiring board 4 with higher stability, while preventing deformation of the printed wiring board 4. However, the projections 51 and the upper surface supports 34 may support the printed wiring board 4 at the same positions.

The conductor plate 5 also includes interference prevention holes 52 so that the lower surface supports 35 do not contact and interfere with the conductor plate 5. The interference prevention holes 52 may be formed by opening parts of the conductor plate 5 as shown in FIG. 4. The interference prevention holes 52 may also be formed by pressing out and denting the conductor plate 5. The conductor plate 5 is supported by the printed wiring board 6.

The printed wiring board 6 includes integrated circuits (not shown), which form the main control circuits. Connectors (not shown) connect the integrated circuits of the printed wiring board 6 to the wiring (not shown) of the printed wiring board 4.

As described above, in the structure for supporting the printed wiring board 4, which is housed in the housing 3 of the video projector 1, of the present embodiment, the video projector 1 includes the conductor plate 5, which is grounded and housed in the housing 3. Further, the printed wiring board 4 includes the substrate 41 and the ground layer 42, which is arranged on the substrate 41.

The feature of the present embodiment is in that the upper surface supports 34, which are formed on the cover 32, and the projections 51, which are formed on the conductor plate 5, hold and support the printed wiring board 4 in between and thereby grounds the ground layer 42 through the conductor plate 5.

When the cover 32 is fixed to the case 31, the printed wiring board 4 contacts the upper surface supports 34 and the projections 51. More specifically, when the cover 32 is fixed to the case 31, the upper surface 4a of the printed wiring board 4 contacts the steps 34c of the upper surface supports 34, and the lower surface 4b of the printed wiring board 4 contacts the projections 51 of the conductor plate 5. In this manner, the upper surface supports 34 (projections) formed on the housing 3 and projections 51 formed on the conductor plate 5 support and fix the printed wiring board 4.

The procedures for supporting and fixing the printed wiring board 4 will now be discussed. First, the printed wiring board 4 is arranged in the cover 32 and loosely held by the upper surface supports 34 and the lower surface supports 35. Then, the cover 32, which loosely holds the printed wiring board 4, is fixed to the case 31, which accommodates the conductor plate 5.

In the present embodiment, as described above, the printed wiring board 4 includes the ground connectors 44, which are arranged on the ground layer 42. The projections 51 formed on the conductor plate 5 contact the ground connectors 44 to electrically connect the ground layer 42 and the conductor plate 5. Thus, although the insulative layer 43 is formed on parts of the ground layer 42, the ground connectors 44, which are arranged on the ground layer 42 are more projected toward the conductor plate 5 than the insulative layer 43, ensure connection of the ground layer 42 and conductor plate 5.

Figure 7:
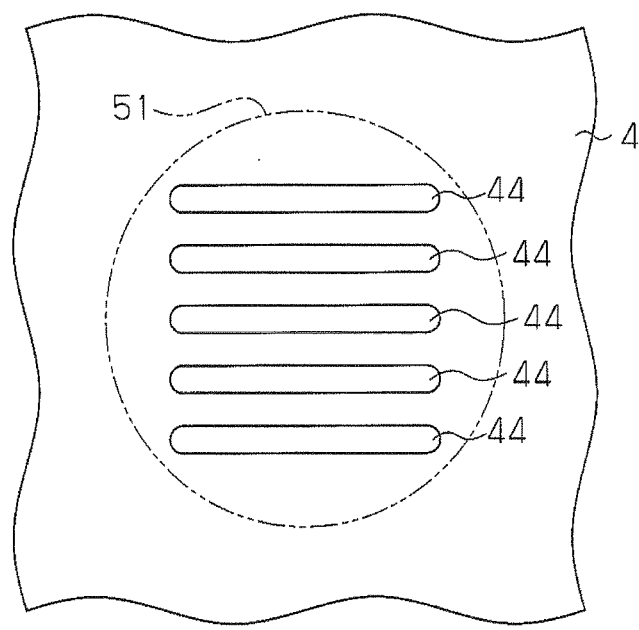
FIG. 7 is a bottom view showing a lower surface of the printed wiring board of FIG. 5.

In the present embodiment, each ground connector 44 is in contact with the corresponding one of the projections 51 formed on the conductor plate 5 at a plurality of locations. For example, as shown in FIG. 7, the ground connector 44 includes a plurality of conductors, which are linear (strip-like) when viewed in the thicknesswise direction T of the printed wiring board 4. The area encompassed by the double-dashed line in FIG. 7 indicates the size of the corresponding projection 51 when viewed from the printed wiring board 4 in the thicknesswise direction T. With this structure, each ground connector 44 contacts the corresponding one of the projections 51 formed on the conductor plate 5 at a plurality of locations. This improves the connection reliability of the ground layer 42 and the conductor plate 5.

In the present invention, the upper surface supports 34 of the housing 3 correspond to the "first projection", and the projections 51 of the conductor plate 5 correspond to the "second projection". The terms "first" and "second" are used to distinguish the elements that they modify and are not intended to indicate any order of priority for such elements.

The structure for supporting the printed wiring board 4 according to the present embodiment has the advantages described below.

(1) The cover 32 of the housing 3 includes the upper surface supports 34, which project toward the printed wiring board 4. The conductor plate 5 includes the projections 51, which project toward the printed wiring board 4. The upper surface supports 34, which are formed on the cover 32, and the projections 51, which are formed on the conductor plate 5, hold and support the printed wiring board 4 in between and thereby ground the ground layer 42 through the conductor plate 5. Thus, the printed wiring board 4 is supported without using fastening components, such as screws, that are inserted through the printed wiring board 4. Further, the ground layer 42 is grounded through the conductor plate 5 by holding and supporting the printed wiring board 4 between the cover 32 and the conductor plate 5. Thus, the ground layer 42 is grounded through the conductor plate 5 without using connecting components such as conductive screws. As a result, there are less fastening components used to support the printed wiring board 4 and less connecting components used to ground the ground layer 42. This allows for reduction in the cost of the video projector 1. Further, since fastening components and connecting components are unnecessary, the space occupied by the printed wiring board 4 in the housing 3 is reduced. This increases the degree of designing freedom for the printed wiring board 4.

(2) Contact of the ground connectors 44 with the projections 51 formed on the conductor plate 5 electrically connects the ground layer 42 and the conductor plate 5. This ensures connection of the ground layer 42 and the conductor plate 5. Thus, the grounding of the ground layer 42 is ensured.

(3) Each ground connector 44 is in contact with the corresponding one of the projections 51 formed on the conductor plate 5 at a plurality of locations. This improves the connection reliability of the ground layer 42 and the conductor plate 5. Accordingly, the grounding of the ground layer 42 is ensured.

(4) The conductor plate 5 covers the printed wiring board 4 with one surface and covers the other printed wiring board 6 with the opposite surface. That is, the upper surface 5a of the conductor plate 5 covers the lower surface 4b of the printed wiring board 4, and the lower surface of the conductor plate 5 covers the upper surface 6a of the printed wiring board 6. Thus, EMC is achieved for the two printed wiring boards 4 and 6 with a single conductor plate 5.

(5) The housing 3 (i.e., the cover 32) includes the upper surface supports 34, which support the upper surface 4a of the printed wiring board 4, and the lower surface supports 35, which support the lower surface 4b of the printed wiring board 4. The upper surface supports 34 and lower surface supports 35 allow for the printed wiring board 4 to be loosely held in the housing 3.

It should be apparent to those skilled in the art that the present invention may be embodied in many other specific forms without departing from the spirit or scope of the invention. Particularly, it should be understood that the present invention may be embodied in the following forms.

Figure 8:
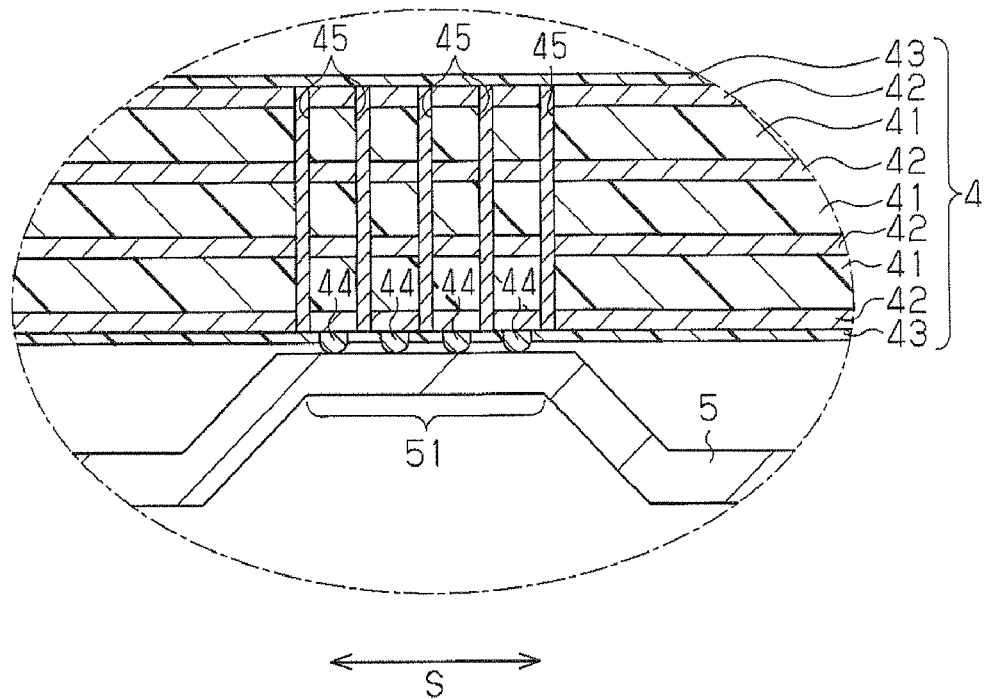
FIG. 8 is a cross-sectional diagram showing a modification of the structure for supporting the printed wiring board of FIG. 5.
Figure 9:
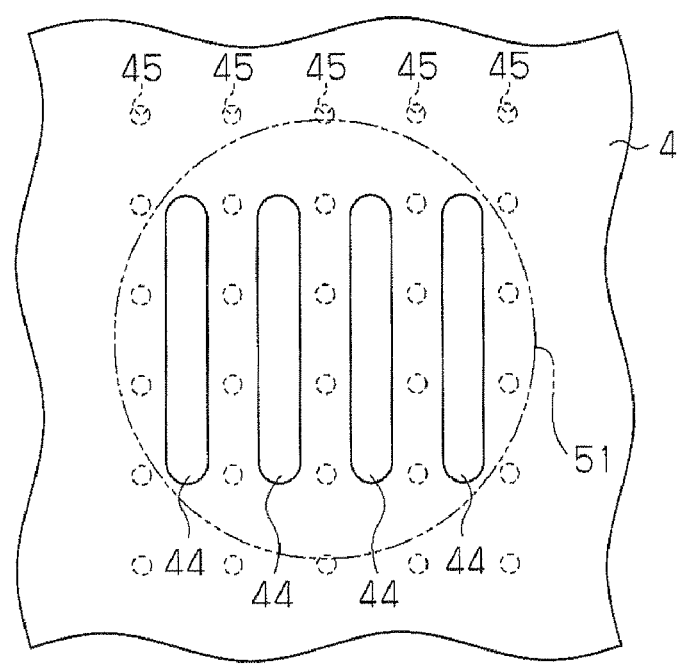
FIG. 9 is a bottom view showing a lower surface of the printed wiring board of FIG. 8.

In the above-described embodiment, the printed wiring board 4 is a double-surface printed wiring board. However, the printed wiring board 4 may be a multilayer printed wiring board. For example, referring to FIG. 8, the printed wiring board 4 may include at least one (for example, three) substrate 41, a plurality of (for example, four) ground layers 42, and at least one via 45 extending through the substrates 41 and ground layers 42. The ground layers 42 may be connected to one another by the vias 45 (plated through holes). In this structure, the housing 3 and the projections 51, which are formed on the conductor plate 5, hold the printed wiring board 4 and ground the ground layers 42. When the ground layers 42 are connected by the vias 45 as described above, it is preferred that the vias 45 be provided to lower the impedance between the ground layers 42 and the conductor plate 5. For example, as shown in FIG. 8, it is preferable that the vias 45 be arranged at predetermined intervals in the planar direction S (one direction in the plane of the printed wiring board 4). As shown in FIG. 9, it is further preferable that the vias 45 be arranged at predetermined intervals in two orthogonal directions in the plane of the printed wiring board 4.

Figure 10:
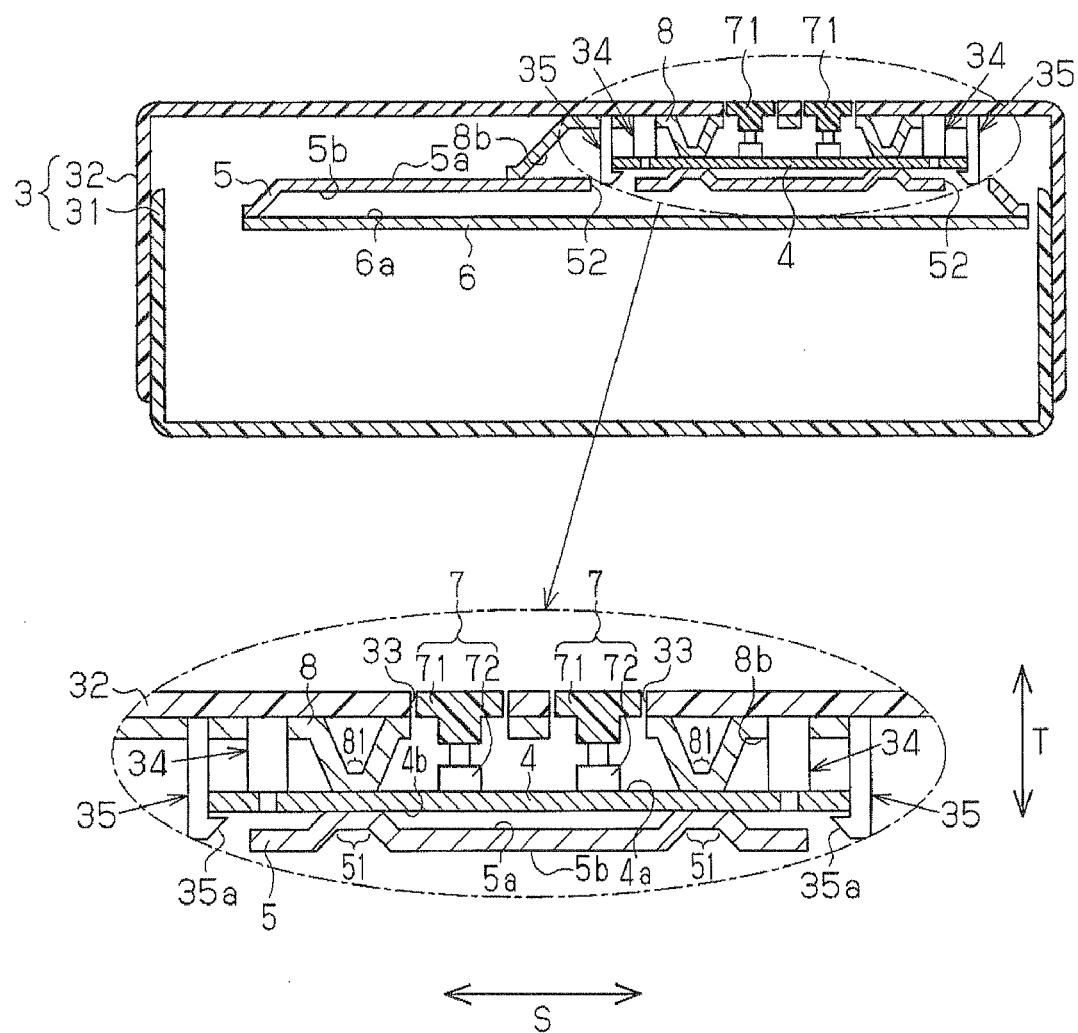
FIG. 10 is a cross-sectional view schematically showing a further conductor plate arranged in the video projector of FIG. 4.

As shown in FIG. 10, the two opposite surfaces of the printed wiring board 4 may be covered by conductor plates 5 and 8. In this example, the video projector 1 includes a further conductor plate 8, which is grounded and accommodated in the housing 3. Here, the upper surface 5a of the conductor plate 5 may cover the lower surface 4b of the printed wiring board 4, and a lower surface 8b of the conductor plate 8 may cover the upper surface 4a of the printed wiring board 4. Like the conductor plate 5, the conductor plate 8 is a metal plate formed from, for example, steel or aluminum. The conductor plate 8 is electrically connected to the conductor plate 5. In this structure, the two opposite surfaces of the printed wiring board 4 are covered by the conductor plates 5 and 8. This achieves ECM more effectively than when covering only one surface of the printed wiring board 4 with the conductor plate 5.

Further, as shown in FIG. 10, when the conductor plate 8 covers the upper surface 4a of the printed wiring board 4, the lower surface supports 35, which are formed on the cover 32, and at least one (for example, four, FIG. 10 shows only two) projection 81, which is formed on the conductor plate 8, may hold and support the printed wiring board 4 in between. In the present invention, the projections 81 correspond to the "third projection". In this case, a ground layer (not shown) arranged on the upper surface 4a of the printed wiring board 4 may be grounded by the conductor plate 8. More specifically, the projections 81, which project from the conductor plate 8 toward the printed wiring board 4 in the same manner as the conductor plate 5, may be formed to contact the ground layer of the printed wiring board 4. The projections 81 may be electrically connected to the ground layer directly. Alternatively, the projections 81 may be electrically connected to the ground layer by further conductors such as the ground connectors 44. The lower surface supports 35 include the hooks 35a, which are contactable with the lower surface 4b of the printed wiring board 4 when the cover 32 is fixed to the case 31, and thereby ensures the holding of the printed wiring board 4.

The shape of the ground connectors 44 may be changed if necessary. In the above-described embodiment, each ground connector 44 includes conductors, which are formed to be linear when viewed in the thicknesswise direction T (refer to FIG. 7). However, for example, the conductors of the ground connector 44 may be circular when viewed in the thicknesswise direction T. Further, the ground connector 44 may be formed by a single conductor instead of a plurality of conductors.

The upper surface supports 34 do not have to be arranged in correspondence with the four corners of the printed wiring board 4. There may be only one upper surface support 34 although it is preferable that there be two or more upper surface supports 34. Further, the upper surface supports 34 do not have to have a circular shape and may have other shapes in accordance with the quantity and location of the upper surface supports 34.

The lower surface supports 35 do not have to be arranged in correspondence with the two sides of the printed wiring board 4. There may be only one lower surface support 35 although it is preferable that there be two or more lower surface supports 35. Further, the lower surface supports 35 do not have to be hook-shaped and may have other shapes in accordance with the quantity and location of the lower surface supports 35.

In the structure that supports the printed wiring board 4 with the upper surface supports 34 of the cover 32 and the projections 51 of the conductor plate 5 as shown in FIG. 4, the lower surface supports 34 may be eliminated.

The projections 51 do not have to be arranged in correspondence with the four corners of the printed wiring board 4. There may be only one projection 51 although it is preferable that there be two or more projections 51. Further, the projections 51 do not have to have a circular shape and may have other shapes in accordance with the quantity and location of the projections 51. The same applies for the ground connectors 44.

In the above-described embodiment, the ground connectors 44 electrically connect the ground layer 42 and the conductor plate 5. However, the projections 51 may be in direct contact with the ground layer 42 to electrically connect the ground layer 42 and conductor plate 5. In other words, the ground connectors 44 may be eliminated.

In the above-described embodiment, electronic components are arranged on the upper surface 4a of the printed wiring board 4. However, electronic components (not shown) may be arranged on the lower surface 4b of the printed wiring board 4. In this case, the projections 51 of the conductor plate 5 have a height H5 (refer to FIG. 6), which is set so that the conductor plate 5 does not contact the electronic components (not shown).

In the above-described embodiment, the video projector 1 is an LCD projector including LCD panels. However, different types of projectors may be used as the video projector 1. That is, the present invention may be applied to a video projector including a different type of picture light generation system. For example, the present invention may be applied to a projector using Digital Light Processing (DLP, registered trademark owned by Texas Instruments Incorporated) technology.

In the above-described embodiment, the present invention is applied to the video projector 1. However, the present invention may also be applied to other electronic devices, such as a television or audio equipment. In such a case, the same advantages as the above-described embodiment are obtained.

The present examples and embodiments are to be considered as illustrative and not restrictive, and the invention is not to be limited to the details given herein, but may be modified within the scope and equivalence of the appended claims.

What is claimed is:

1. A structure for supporting a printed wiring board housed in a housing of an electronic device, the structure comprising:
    a first projection formed on the housing and projecting toward the printed wiring board, the electronic device including a conductor plate, which is grounded and accommodated in the housing; and
    a second projection formed on the conductor plate and projecting toward the printed wiring board, the printed wiring board including a substrate and a ground layer, which is arranged on the substrate;
    wherein the printed wiring board is supported and held between the first projection of the housing and the second projection of the conductor plate to electrically ground the ground layer through the conductor plate.

2. The structure according to claim 1, wherein the printed wiring board further includes a ground connector arranged on the ground layer; and
    the second projection of the conductor plate contacts the ground connector to electrically connect the ground layer and the conductor plate.

3. The structure according to claim 2, wherein the ground connector is arranged on part of the ground layer.

4. The structure according to claim 2, wherein the printed wiring board further includes an insulative layer arranged on the ground layer so as to expose the ground connector.

5. The structure according to claim 4, wherein the ground connector is more projected toward the conductor plate than the insulative layer.

6. The structure according to claim 2, wherein the ground connector is formed from solder.

7. The structure according to claim 2, wherein the ground connector includes a plurality of conductors that contact the second projection of the conductor plate.

8. The structure according to claim 7, wherein the plurality of conductors are linear and spaced apart from each other.

9. The structure according to claim 1, wherein the first projection supports the printed wiring board from above, and the second projection supports the printed wiring board from below at a position located inward from the first projection.

10. The structure according to claim 9, wherein the second projection is pressed out of the conductor plate.

11. The structure according to claim 1, wherein the first projection is one of a plurality of first projections formed on the housing, and the second projection is one of a plurality of second projections formed on the conductor plate.

12. The structure according to claim 11, wherein the plurality of first projections and the plurality of second projections are arranged in correspondence with four corners of the printed wiring board.

13. The structure according to claim 1, wherein the ground layer is one of a plurality of ground layers formed on the printed wiring board, and the printed wiring board includes a via extending through the substrate and electrically connecting the plurality of ground layers.

14. The structure according to claim 1, wherein the conductor plate includes:
    a surface covering the printed wiring board; and
    a further surface covering a further printed wiring board.

15. The structure according to claim 1, wherein the housing includes:
    an upper surface support formed on the housing to support an upper surface of the printed wiring board and serve as the first projection; and
    a lower surface support formed on the housing to support a lower surface of the printed wiring board.

16. The structure according to claim 15, wherein the conductor plate includes an interference prevention hole which prevents contact between the lower surface support and the conductor plate.

17. The structure according to claim 15, wherein the lower surface support is one of a plurality of lower surface supports formed on the housing, and the plurality of lower surface supports are arranged at locations corresponding to two opposing sides of the printed wiring board.

18. The structure according to claim 1, wherein the electronic device further includes a further conductor plate, which is grounded and accommodated in the housing, with two opposite surfaces of the printed wiring board being covered by the conductor plate and the further conductor plate.

19. The structure according to claim 18, wherein the further conductor includes a third projection formed on the further conductor plate and projecting toward the printed wiring board; and
    the printed wiring board is supported and held between the first projection of the housing, the second projection of the conductor plate, and the third projection of the further conductor plate.

20. An electronic device comprising:
    a printed wiring board including a substrate and a ground layer, which is arranged on the substrate;
    a housing that houses the printed wiring board, the housing including a first projection formed on the housing and projecting toward the printed wiring board;
    a conductor plate grounded and accommodated in the housing, the conductor including a second projection formed on the conductor plate and projecting toward the printed wiring board;
    wherein the printed wiring board is supported and held between the first projection of the housing and the second projection of the conductor plate to electrically ground the ground layer through the conductor plate.

* * * * *